United States Patent
Chang et al.

(10) Patent No.: US 10,825,817 B2
(45) Date of Patent: Nov. 3, 2020

(54) LAYOUT OF SEMICONDUCTOR STRUCTURE, SEMICONDUCTOR DEVICE AND METHOD OF FORMING THE SAME

(71) Applicants: UNITED MICROELECTRONICS CORP., Hsin-Chu (TW); Fujian Jinhua Integrated Circuit Co., Ltd., Quanzhou (CN)

(72) Inventors: Feng-Yi Chang, Tainan (TW); Yu-Cheng Tung, Kaohsiung (TW); Fu-Che Lee, Taichung (TW)

(73) Assignees: UNITED MICROELECTRONICS CORP., Hsin-Chu (TW); Fujian Jinhua Integrated Circuit Co., Ltd., Quanzhou (CN)

( * ) Notice: Subject to any disclaimer, the term of this patent is extended or adjusted under 35 U.S.C. 154(b) by 51 days.

(21) Appl. No.: 15/857,642

(22) Filed: Dec. 29, 2017

(65) Prior Publication Data

US 2019/0172831 A1 Jun. 6, 2019

(30) Foreign Application Priority Data

Dec. 4, 2017 (CN) .......................... 2017 1 1262227

(51) Int. Cl.
*H01L 27/108* (2006.01)
*H01L 27/02* (2006.01)

(52) U.S. Cl.
CPC .... *H01L 27/10855* (2013.01); *H01L 27/0207* (2013.01); *H01L 27/10808* (2013.01); *H01L 27/10897* (2013.01); *H01L 27/10894* (2013.01)

(58) Field of Classification Search
CPC ......... H01L 27/10808; H01L 27/10855; H01L 27/10897; H01L 27/10894; H01L 27/0207
See application file for complete search history.

(56) References Cited

U.S. PATENT DOCUMENTS

| 9,012,326 B2 | 4/2015 | Kim et al. |
| 2006/0263699 A1 | 11/2006 | Abatchev et al. |
| 2016/0336192 A1 | 11/2016 | Park |
| 2017/0110653 A1 | 4/2017 | Seo |
| 2017/0186613 A1 | 6/2017 | Kim et al. |

FOREIGN PATENT DOCUMENTS

| CN | 202563242 U | 11/2012 |
| CN | 103119733 A | 5/2013 |

*Primary Examiner* — Douglas M Menz
(74) *Attorney, Agent, or Firm* — Winston Hsu

(57) ABSTRACT

A layout of semiconductor structure includes plural patterns arranged along a first direction to form plural columns, with each pattern spaced from each other. A region is defined by the patterns, and which includes a first edge and a second edge, with the first edge extended along the first direction, and the second edge extended along a second direction different from the first direction and being serrated. The second edge includes plural fragments, with each fragment being defined by at least two patterns. The present invention also provided a semiconductor device and a method of forming the same.

20 Claims, 7 Drawing Sheets

|←——————— A ———————→|←——— B ———→|

LAYOUT OF SEMICONDUCTOR STRUCTURE, SEMICONDUCTOR DEVICE AND METHOD OF FORMING THE SAME

BACKGROUND OF THE INVENTION

1. Field of the Invention

The present invention relates to a layout of semiconductor structure, a semiconductor device and a method of forming the same, and more particularly to a layout of semiconductor structure in an array arrangement, a semiconductor device having such layout and a method of forming the same.

2. Description of the Prior Art

Fabrication of microstructures requires tiny elements of precisely controlled size formed in a material layer of an appropriate substrate such as semiconductor substrate/layers, dielectric layers and/or metal layers. These tiny elements are generated by patterning the abovementioned substrate/layers, for instance, by performing photolithography and etching processes. For this purpose, in conventional semiconductor techniques, a mask layer is formed on the target, and these tiny elements are defined in the mask layer and followed by being transferred to the target layer. Generally, the mask layer may include or is formed by means of a layer of photoresist that is patterned by lithographic process and/or patterned hard mask including the patterns transferred from the patterned photoresist.

As feature sizes are decreased by the complexity of currently integrated circuits, the existing single patterning process has met its bottleneck to successfully render the features. That is, the overlay accuracy and the resolution among this feature have to push the lithographic limit further to create even smaller, more densely packed devices. Therefore, it is still urgent to those of skilled in the art to develop or improve the conventional scheme for these tiny elements.

SUMMARY OF THE INVENTION

It is one of the primary objectives of the present invention to provide a layout of semiconductor structure. The layout includes plural patterns arranged along an irregular serrated edge, so as to form a dense region or a memory cell region of a semiconductor structure for improving the process window thereof.

It is another one of the primary objectives of the present invention to provide a semiconductor device. The semiconductor device includes plural patterns arranged along an irregular serrated edge to form a dense region or a memory cell region of the semiconductor device. That is, the process window of the semiconductor device is therefore improved.

It is another one of the primary objectives of the present invention to provide a forming method of semiconductor device, in which, a multiple-patterning process such as a sidewall image transfer technique, is used in accompany with various photomasks to form plural patterns arranged along an irregular serrated edge. That is, the forming method of the present invention is able to form a smaller, more densely packed layout or semiconductor structure under a cost-saving and simplified process flow by using fewer photomasks.

To achieve the purpose described above, the present invention provides a layout of a semiconductor structure, including a plurality of patterns spaced from each other, with a region being defined by the patterns. The region includes a first edge extended along a first direction, and a second edge extended along a second direction different from the first direction and being serrated. The second edge includes a plurality of fragments, and each of the fragments is defined by at least two patterns.

To achieve the purpose described above, the present invention provides a semiconductor device, including a substrate and a material layer disposed on the substrate. The substrate has a first region and a second region, and the material layer includes a plurality of patterns spaced from each other. The first region is defined by the patterns, and which includes at least two serrated edges. Each of the edges includes a plurality of fragments, and each of the fragments is defined by at least two patterns.

To achieve the purpose described above, the present invention provides a method of forming a semiconductor device including the following steps. First of all, a substrate is provided to include a first region and a second region. Then, a material layer is formed on the substrate, and the material layer includes a plurality of patterns spaced from each other. The first region is defined by the patterns, and which includes at least two serrated edges. Each of the edges includes a plurality of fragments, and each of the fragments is defined by at least two patterns.

Overall, the present invention utilizes the sidewall image transfer technique accompanied with various photomasks to form plural patterns arranged along an irregular serrated edge. Through this performance, the present invention is able to form a smaller, more densely packed layout or semiconductor structure under a cost-saving and simplified process flow by using fewer photomasks.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 to FIG. 4 are schematic diagrams illustrating a method of forming a semiconductor device according to a preferred embodiment of the present invention, in which:

FIG. 2 shows a schematic diagram of a semiconductor device after forming each photomask;

FIG. 3 shows a schematic diagram of a semiconductor device after patterning a mask layer;

FIG. 4 shows a schematic diagram of a semiconductor device after patterning a material layer.

FIG. 5 to FIG. 6 are schematic diagrams illustrating an example according to a preferred embodiment of the present invention, in which:

FIG. 5 shows a cross-sectional view of a semiconductor device at the beginning of the forming process;

FIG. 6 shows a cross-sectional view of a semiconductor device after patterning a conductive layer.

DETAILED DESCRIPTION

To provide a better understanding of the presented invention, preferred embodiments will be described in detail. The preferred embodiments of the present invention are illustrated in the accompanying drawings with numbered elements.

Figure 1:
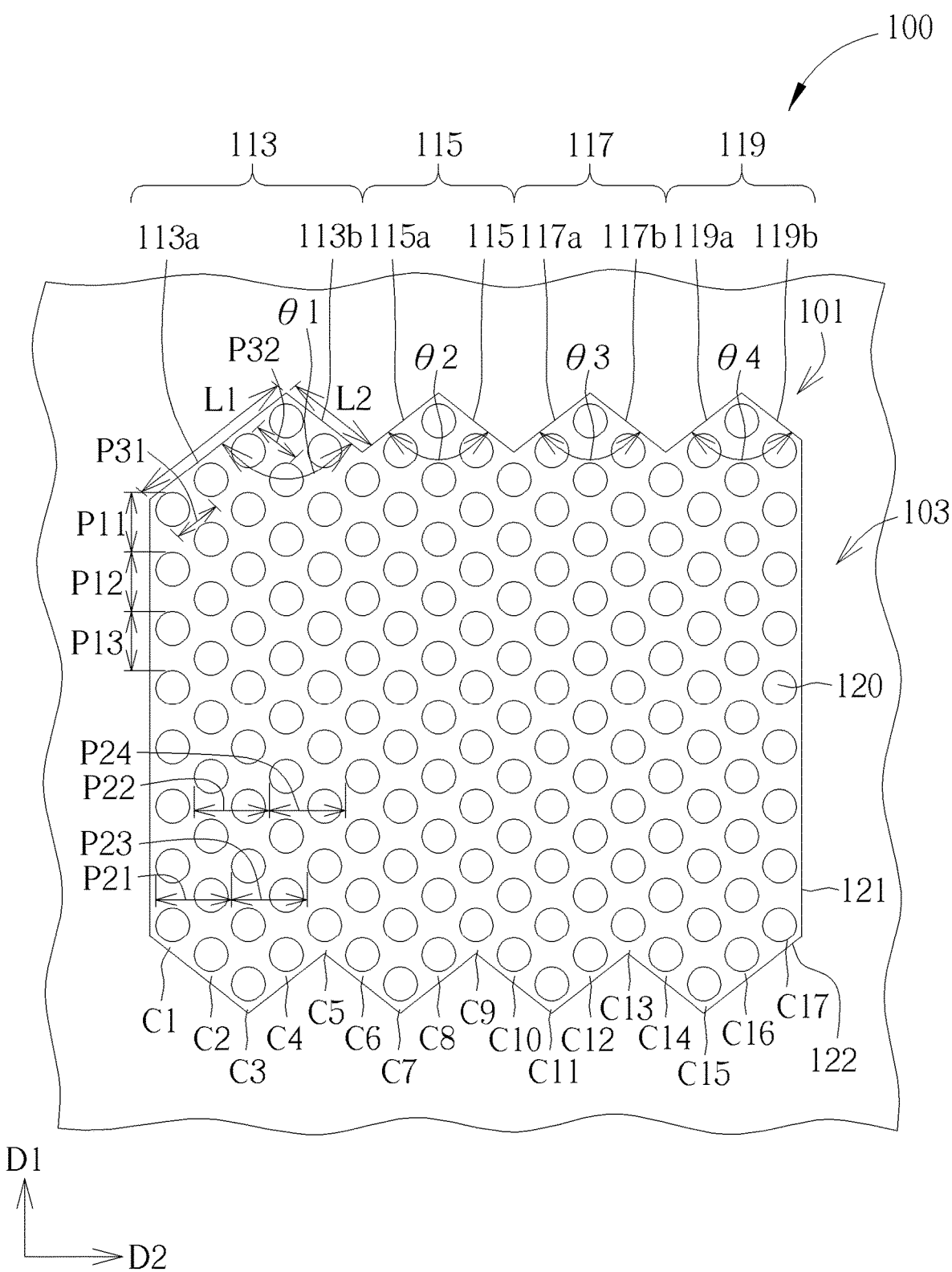
FIG. 1 is a schematic diagram illustrating a layout of a semiconductor structure according to a first embodiment of the present invention.

Please refer to FIG. 1, a schematic diagram of a layout 100 of a semiconductor structure according to the first embodiment of the present invention is shown. The layout 100 includes a plurality of patterns 120, and the formation of the patterns 120 is for example accomplished by etching a suitable material layer such as a semiconductor layer or a conductive layer. Precisely speaking, each patterns 120 are arranged along a first direction D1, such as a y-direction, to form a plurality of columns C1-C17 of the patterns 120, with each patterns 120 being spaced from each other and having a pitch P11, P12, P13 in the first direction D1. It is noted that, the pitches P11, P12, P13 among the patterns 120 may be optionally the same with each other as shown in FIG. 1, or may be optionally different form each other (not shown in the drawings) within a difference of about 5% to 10% length of each pattern 120, but is not limited thereto. The patterns 120 are arranged intensively and regularly to define a region 101, such as a dense region of a semiconductor device or a memory cell region of a semiconductor memory device, and the portion outside the region 103 is therefore defined as another region 103, such as an isolation region or a periphery region.

The patterns 120 arranged in odd columns C1, C3, C5, C7, C9, C11, C13, C15, C17 are in alignment with each other along a second direction D2 (such as a x-direction) which is perpendicular to the first direction D1, and each patterns 120 are spaced from each other and have a pitch P21, P23, as shown in FIG. 1. Also, the patterns 120 arranged in even columns C2, C4, C6, C8, C10, C12, C14, C16 are in alignment with each other along the second direction D2, and each patterns 120 are spaced from each other and have a pitch P22, P24. It is noted that, the pitches P21, P22, P23, P24 among the patterns 120 may be optionally the same with each other as shown in FIG. 1, or may be optionally different form each other (not shown in the drawings) within a difference of about 5% to 10% length of each pattern 120, but is not limited thereto. On the other hand, the patterns 120 arranged in two adjacent columns are alternately arranged by a predetermined gap, in the second direction D2. For example, the patterns 120 arranged in the column C1 and the column C2 are alternately arranged within a misalignment of about ½ pitch P1, as shown in FIG. 1. Furthermore, patterns 120 arranged in each column may optionally have the same or different quantities of patterns 120. For example, patterns 120 arranged in column C3 and column C4 are in the same quantity, and which are alternately arranged from each other. On the other hand, patterns 120 arranged in column C1 and column C2 are in different quantities, and which are also alternately arranged from each other. Through the aforementioned arrangement, the entire region 101 is therefore defined by the outfitting of those alternately arranged patterns 120 in each column C1-C17, to have two serrated edges 122 opposite to each other along the second direction D2. In the present embodiment, the two serrated edges 122 are not asymmetric with each other.

Precisely speaking, each of the serrated edges 122 further includes a plurality of serrated portions 113, 115, 117, 119 and each of the serrated portions 113, 115, 117, 119 are defined by two fragments 113a, 113b, 115a, 115b, 117a, 117b, 119a, 119b which are extended from two different directions (not shown in the drawings) different from the first direction D1 and the second direction D2. That is, each of the serrated portions 113, 115, 117, 119 may obtain an angle θ1, θ2, θ3, θ4 between 50 degrees and 70 degrees. It is noted that, the angle θ1, θ2, θ3, θ4 of each serrated portion 113, 115, 117, 119 may be optionally the same from each other, such as the angles θ2, θ3, θ4 of the serrated portions 115, 117, 119. However, the angle θ1, θ2, θ3, θ4 of each serrated portion 113, 115, 117, 119 may also be different from each other, such as the angles θ1, θ2 of the serrated portions 113, 115. Also, each fragment 113a, 113b, 115a, 115b, 117a, 117b, 119a, 119b of the serrated portions 113, 115, 117, 119 is preferable defined by two or more than two arranged patterns 120, with the two arranged patterns 120 spaced from each other and having a pitch P31, P32. The pitches P31, P32 among the patterns 120 may be optionally the same with each other as shown in FIG. 1, or may be optionally different form each other (not shown in the drawings) within a difference of about 5% to 10% length of each pattern 120, but is not limited thereto. Moreover, the pitch P31, the pitch P21 and the pitch P11 may be the same or different from each other, so that, a length of each fragment 113a, 113b, 115a, 115b, 117a, 117b, 119a, 119b may be about two times or more than two times of a length of the pitch P31, P32. For example, the fragment 113a is formed by four arranged patterns 120, and a length L1 thereof may be substantially about four times of the length of the pitch P31, and the fragment 113b is formed by two arranged patterns 120, and a length L2 thereof may be two times of the length of the pitch P32, as shown in FIG. 1.

On the other hand, the region 101 has two vertical edges opposite to each other along the first direction D1, due to the regular arrangement of the patterns 120 along the first direction D1. People in the art should well understand that, although the present embodiment is exemplified by defining the region 101 with two asymmetric serrated edges 122, people well skilled in the art should easily realize the present invention is not limited thereto. In another embodiment, the arrangement of patterns 120 may also be further adjusted according to practical requirement to define a region having two symmetric serrated edges.

According to above, the layout 100 of the semiconductor structure in the first preferred embodiment is provided, and which includes the region 101 defined by the arrangement of patterns 120. The region 101 has two vertical edges 121 along the first direction D1 and two serrated edges 122 along the second direction D2, with each of the serrated edges 122 further including the serrated portions 113, 115, 117, 119 defined by fragments 113a, 113b, 115a, 115b, 117a, 117b, 119a, 119b. Please note that, each fragment 113a, 113b, 115a, 115b, 117a, 117b, 119a, 119b is defined by two or more than two arranged patterns 120, so as to facilitate the etching process and lithography process while forming the patterns 120. Furthermore, since the layout 100 of the present embodiment includes the region 101 with irregular edge defined by those alternately arranged patterns 120, the deposition of the region 101 may be more flexible, so as to increase the process window thereof.

Figure 2:
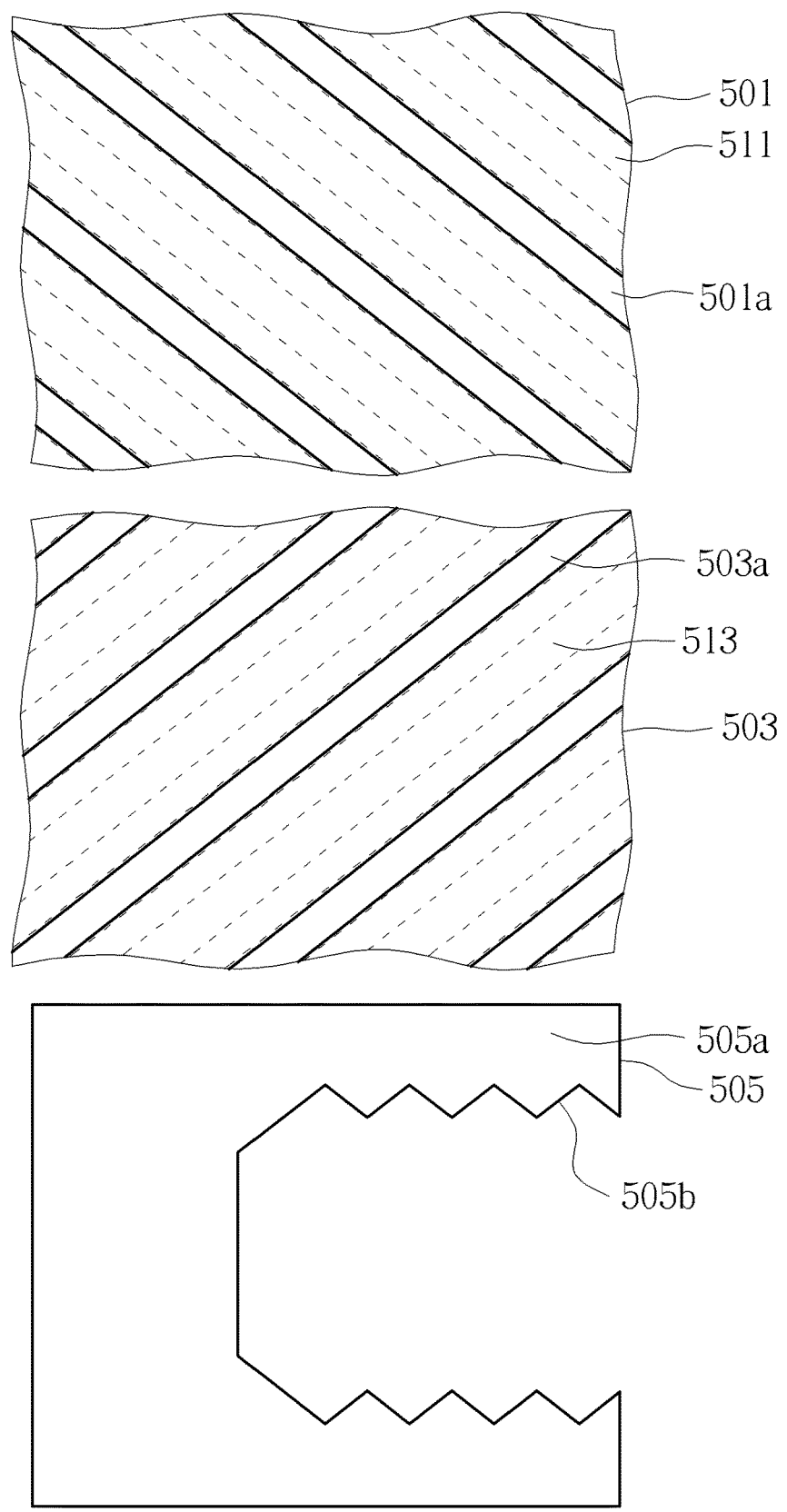
Figure 3:
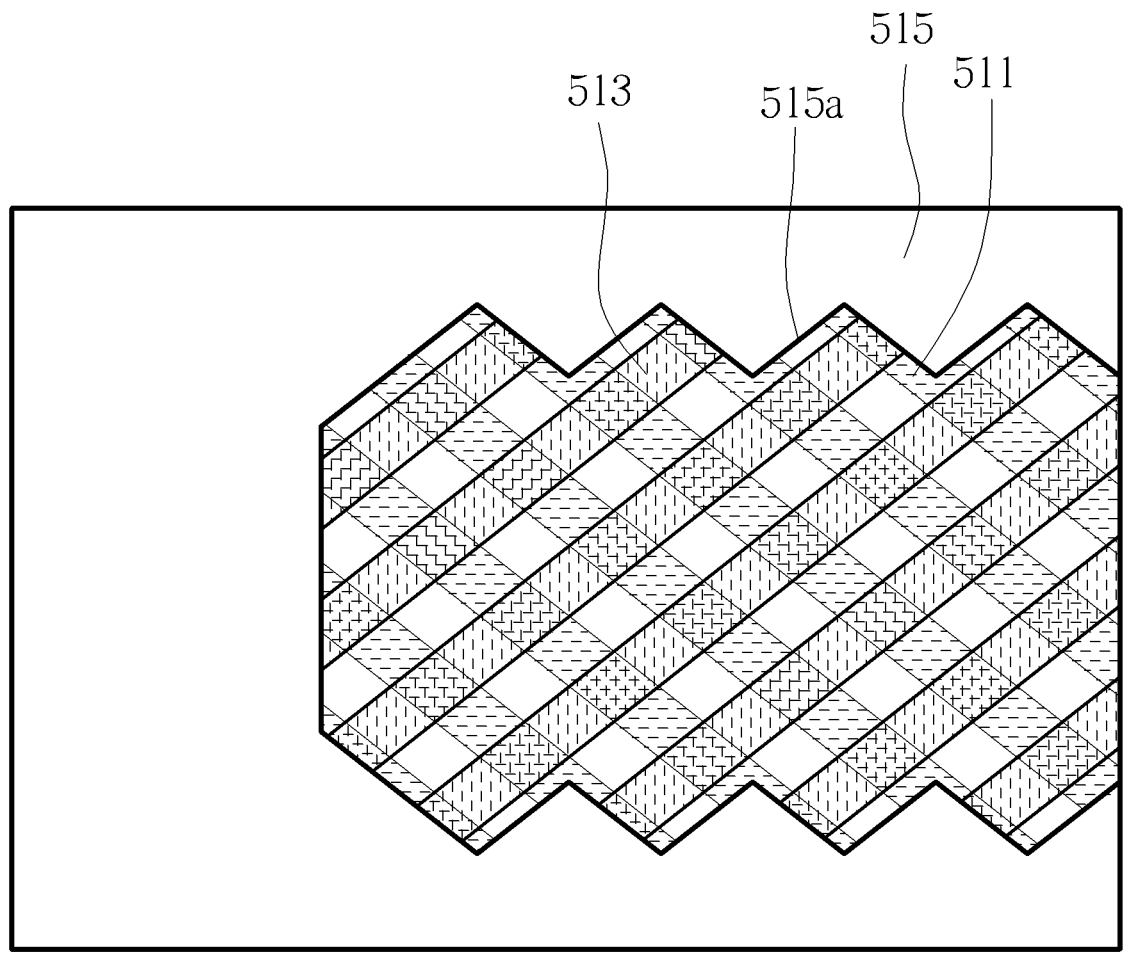
Figure 4:
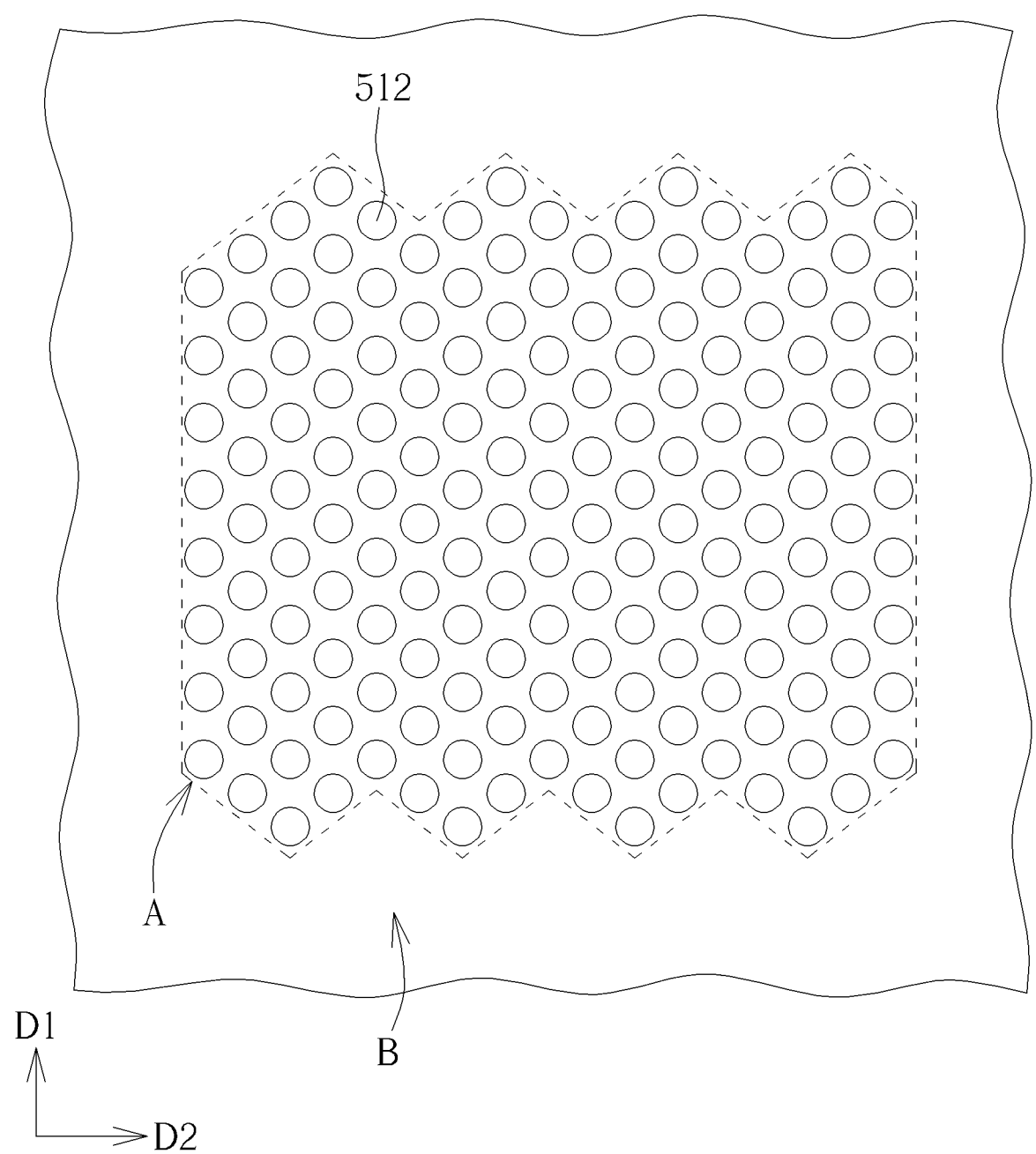

Then, please refer to FIGS. 2-4, a method of forming the layout of semiconductor structure is shown. Firstly, a material layer (not shown in the drawings), for example including a semiconductor material, a dielectric material or a conductive material, is provided. Next, various photoresist layers (not shown in the drawings) in accordance with photomasks 501, 503, 505 are respectively and sequentially formed on the material layer, with the photomask 501 defining a plurality of entity patterns 501a parallelly extended along a direction, with the photomask 503 defining a plurality of entity patterns 503s parallelly extended along another direction, and with the photomask 505 only defining an entity patters 505a. That is, through the entity patterns 501a, corresponding photoresist patterns are formed on the corresponding photoresist layer (not shown in the drawings), followed by performing a sidewall image transfer technique to form a plurality of corresponding patterns 511 on a mask layer (not shown in the drawings) underneath, through the entity patterns 503a, another corresponding photoresist patterns are formed on the corresponding photoresist layer (not shown in the drawings), followed by performing another sidewall image transfer technique to form a plurality of corresponding patterns 513 on the mask layer, to cross and not perpendicular to the corresponding patterns 511 as shown in FIG. 3, and then, through the entity pattern 505a, a corresponding photoresist pattern is formed, followed by performing an etching process, to form a corresponding pattern 515 on another mask layer to partially cover the corresponding patterns 511, 513, as shown in FIG. 3. On the other hand, the formation of the corresponding patterns 511, 513 may also be accomplished through a double patterning process.

It is noted that, since the entity patterns 505a defined by the photomask 505 has a serrated edge 505b, the corresponding patterns 515 formed accordingly may also include a serrated edge 515a, with each fragment of the serrated edge 515a preferrably overlapped the each corresponding patterns 511, 513, as shown in FIG. 3. While performing an etching process by simultaneously using the corresponding patterns 511, 513, 515 as a mask, a plurality of openings 512 is formed in the material layer, and a region A with such formed openings 512 and a region B without such opening 512 are therefore defined as well, as shown in FIG. 4. The region A includes two vertical edges opposite to each other along the first direction D1, and two serrated edges opposite to each other along the second direction D2, with each of the serrated edges including a plurality of serrated portions defined by various fragments extended along the directions different from the first direction D1 and the second direction D2, as shown in FIG. 4. It is noteworthy that, although the openings formed by the crossed region of the stripe-shaped corresponding patterns 511 (according to the entity patterns 501a) and the stripe-shaped corresponding patterns 513 (according to the entity patterns 503a) may also have a quadrangle shape, the openings 512 being formed under the practical process like exposure, development and etching are actually in a circular or oval shape, as shown in FIG. 4.

Figure 5:
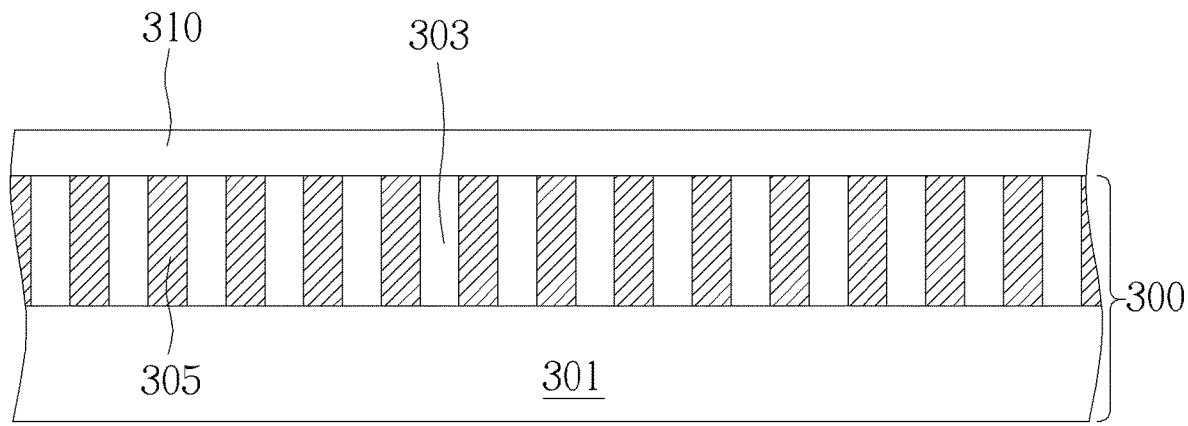

Although the present embodiment is exemplified by forming the openings 512 to form the layout, the present invention is not limited thereto. In other embodiments, the aforementioned photomasks may be used in accompany with positive photoresist, negative photoresist and double patterning process, to form a plurality of entity patterns (not shown in the drawings) on the material layer. Also, the formed layout of semiconductor structure may be practical applied on a semiconductor process, for example a process of a semiconductor memory device like a dynamic random access memory (DRAM) device, to form the pads electrically connected to each storage node contact (SNC). For example, in one embodiment, a substrate layer 300 is provided, and which includes a semiconductor substrate 301 such as a silicon substrate, and a dielectric layer 303 such as including silicon nitride, disposed on the semiconductor substrate 301. In one embodiment, a plurality of buried transistors (not shown in the drawings) may be formed in the semiconductor substrate 301 to function like word lines (WL), and a plurality of bit lines (BLs, not shown in the drawings) and a plurality of plugs 305 are formed in the dielectric layer 303 on the semiconductor substrate 301, as shown in FIG. 5. The bit lines and the plugs 305 are alternately arranged in one direction (not shown in the drawings).

Figure 6:
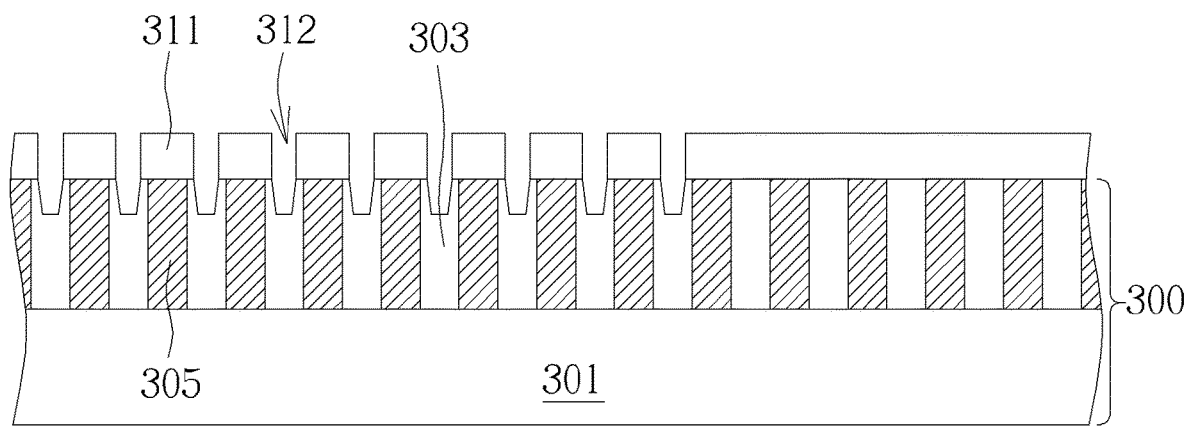

Following these, a conductive layer 310 is formed on the substrate layer 300, to configure as aforementioned material layer. The conductive layer 310 for example includes a low resistant metal like tungsten (W), alumina (Al) or copper (Cu). In this way, while performing the aforementioned process as shown in FIGS. 2-4, the conductive layer 310 is patterned to form a plurality of conductive patterns 311, and a plurality of openings 312, as shown in FIG. 6. That is, each conductive patterns 311 may directly in contact with the plugs 305 underneath to function like a storage node pad (SN pad), so that, each plugs 305 may be further electrically connected to a source/drain region (not shown in the drawings) of the transistor via a silicide layer (not shown in the drawings), to function like a SNC. Then, the region A having the formed conductive patterns 311 and the openings 312 may therefore form a memory cell region, and the region B may therefore form a periphery region.

However, the present forming method is not limited to be applied to the semiconductor memory process above, and in another embodiment, the method may also be applied to other semiconductor processes for forming smaller, more densely packed layout or semiconductor structure under a cost-saving and simplified process flow by using fewer photomasks. Also, people skilled in the arts may fully understand that the layout of the semiconductor structure, as well as the forming method thereof, is not limited thereto. The following description will detail the different embodiments of the layout and the forming method thereof in the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 7:
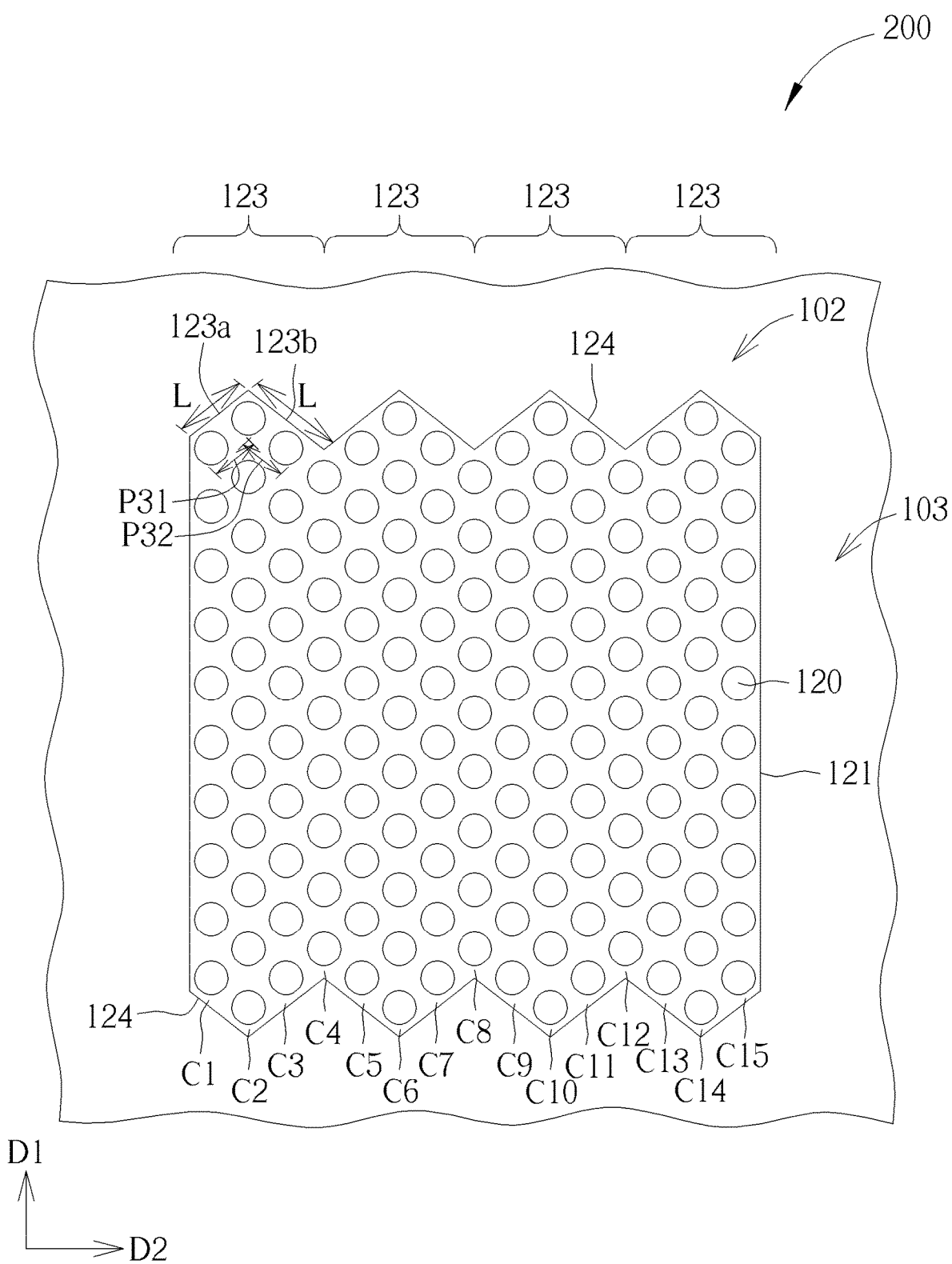
FIG. 7 is a schematic diagram illustrating a layout of a semiconductor structure according to a second embodiment of the present invention.

Please refer to FIG. 7, a schematic diagram of a layout 200 of a semiconductor structure according to the second embodiment of the present invention is shown. The layout 200 in the present embodiment is similar to those in the first embodiment, and the similarity thereof will not redundantly describe herein. The differences between the present embodiment and the aforementioned first embodiment are that, the patterns 120 arranged in each odd column C1, C3, C5, C7, C9, C11, C13, C15 are in the same quantity, so that, the alternately arranged patterns 120 in each column C1-15 may therefore define two symmetric serrated edges 124 along the second direction D2.

Precisely, each serrated edges 124 includes a plurality of serrated portions 123, each of the serrated portions 123 is defined by two fragments 123a, 123b being defined by the same quantity of arranged patterns 120 as shown in FIG. 7. That is, a length L of each fragment 123a, 123b is substantially the same, and the length L is about two times of the length of the pitch P31, P32 as shown in FIG. 7. In another embodiment, the length L may also be more than two times of the length of the pitch P31, P32.

According to above, the layout 200 of the semiconductor structure in the present embodiment also includes the patterns 120 with the outfitting thereof to define the region 102 with two symmetric serrated edges, so as to facilitate the etching process and lithography process while forming the patterns 120. Furthermore, since the layout 200 of the present embodiment includes the region 102 with irregular edges defined by those alternately arranged patterns 120, the deposition of the region 102 may be more flexible, so as to increase the process window thereof.

Figure 8:
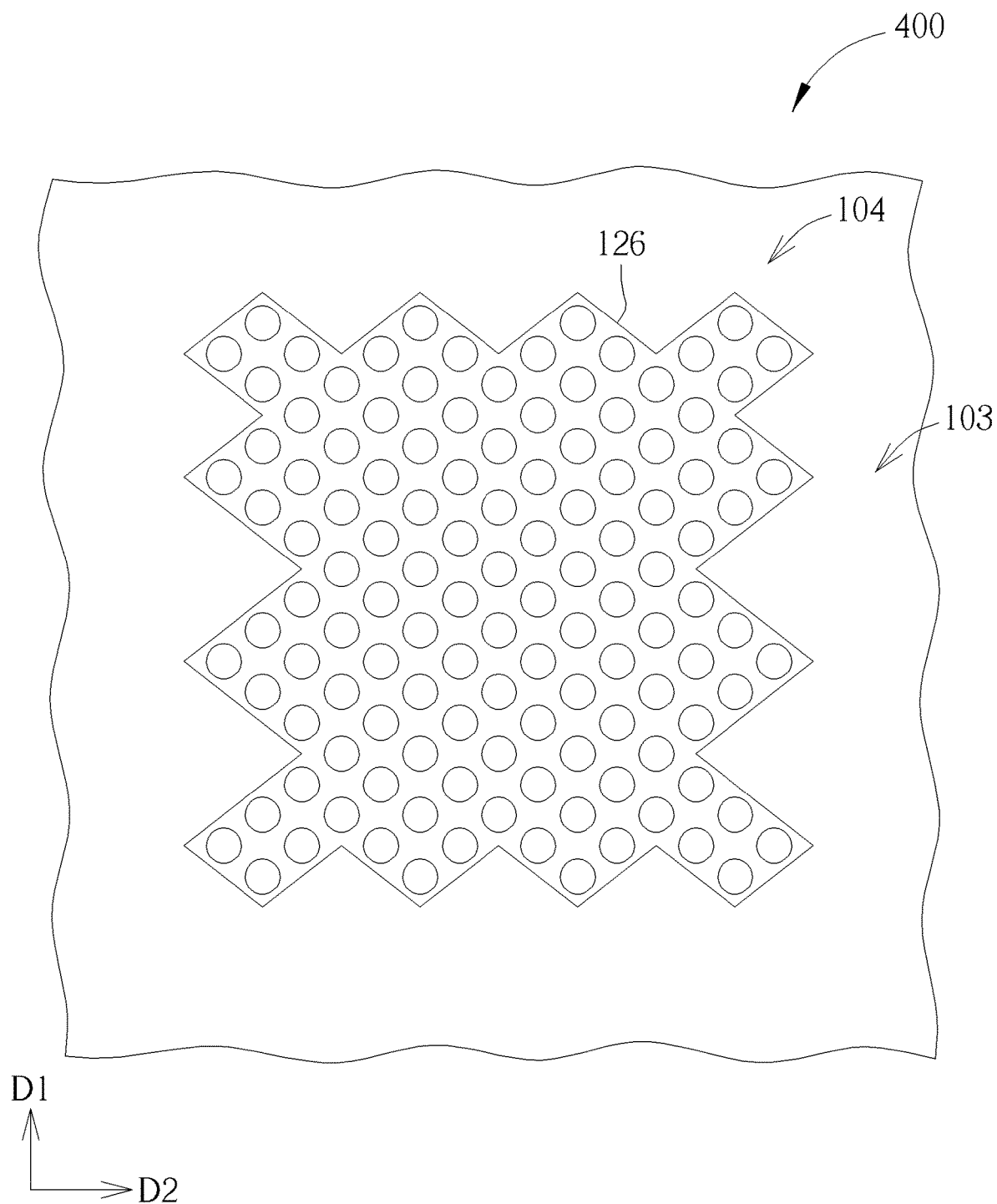
FIG. 8 is a schematic diagram illustrating a layout of a semiconductor structure according to a third embodiment of the present invention.

Please refer to FIG. 8, a schematic diagram of a layout 400 of a semiconductor structure according to the third embodiment of the present invention is shown. The layout 400 in the present embodiment is similar to those in the first embodiment, and similarity thereof will not redundantly describe herein. The differences between the present embodiment and the aforementioned first embodiment are that, the region 104 defined by those alternately arranged patterns 120 in the present embodiment includes the serrated edges 126 both along the first direction D1 and in the second direction D2. The two serrated edges 126 opposite to each other may be optionally symmetric with each other as shown in FIG. 8, or may also be asymmetric with each other, so that, the deposition of the region 104 may be further flexible, so as to increase the process window thereof.

Overall, the present invention utilizes the sidewall image transfer technique accompanied with various photomasks to form plural patterns arranged along an irregular serrated edges. Through this performance, the present invention is able to form a smaller, more densely packed layout or semiconductor structure under a cost-saving and simplified process flow by using fewer photomasks.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A layout of semiconductor structure, comprising:
a plurality of patterns arranged along a first direction to form a plurality of columns, each of the patterns being spaced from each other and a region being defined by the patterns and comprising:
a first edge extended along the first direction; and
a second edge extended along a second direction different from the first direction and being serrated, wherein the second edge comprises a plurality of fragments, and each of the fragments is defined by at least two patterns.

2. The layout of semiconductor structure according to claim 1, wherein the two fragments adjacent to each other are extended along two different directions which are different from the first direction and the second direction, and the two different directions are across and not perpendicular to each other.

3. The layout of semiconductor structure according to claim 1, wherein the patterns arranged in odd columns are in alignment with each other along the second direction.

4. The layout of semiconductor structure according to claim 1, wherein the patterns arranged in even columns are in alignment with each other along the second direction.

5. The layout of semiconductor structure according to claim 1, wherein the patterns arranged in two adjacent columns are alternately arranged with each other along the second direction.

6. The layout of semiconductor structure according to claim 1, wherein the region further comprises a third edge extended along the second direction, and the third edge is opposite to the second edge and is serrated.

7. The layout of semiconductor structure according to claim 6, wherein the third edge and the second edge are asymmetric.

8. The layout of semiconductor structure according to claim 6, wherein the third edge and the second edge are symmetric.

9. A semiconductor device, comprising:
a substrate, having a first region and a second region; and
a material layer disposed on the substrate, the material layer comprising a plurality of patterns spaced from each other, wherein the first region is defined by the patterns, and which comprises at least two serrated edges, each of the edges comprises a plurality of fragments, and each of the fragments is defined by at least two patterns.

10. The semiconductor device according to claim 9, wherein the at least two serrated edges are symmetric.

11. The semiconductor device according to claim 9, wherein the at least two serrated edges are asymmetric.

12. The semiconductor device according to claim 9, wherein each of the serrated edges comprises a plurality of serrated portions, and each of the serrated portions is defined by two adjacent fragments.

13. The semiconductor device according to claim 12, wherein the two adjacent fragments extended along two different directions, and the two different directions are across and not perpendicular to each other.

14. The semiconductor device according to claim 9, wherein the patterns are arranged along a first direction to form a plurality of columns, and the patterns arranged in odd columns are in alignment with each other along a second direction different from the first direction.

15. The semiconductor device according to claim 14, wherein the patterns arranged in even columns are in alignment with each other along the second direction.

16. The semiconductor device according to claim 14, wherein the patterns arranged in two adjacent columns are alternately arranged from each other along the second direction.

17. The semiconductor device according to claim 9, further comprising:
a plurality of bit lines disposed on the substrate, within the first region, below the material layer; and
a plurality of plugs disposed on the substrate, within the first region, the plugs and the bit lines are alternately arranged, and the patterns are disposed on the plugs.

18. A method of forming semiconductor device, comprising:
providing a substrate, the substrate having a first region and a second region; and
forming a material layer on the substrate, the material layer comprising a plurality of patterns spaced from each other, wherein the first region is defined by the patterns and which comprises at least two serrated edges, each of the edges comprises a plurality of fragments, and each of the fragments is defined by at least two patterns.

19. The method of forming semiconductor device according to claim 18, wherein the patterns are arranged along a first direction to form a plurality of columns, and the patterns arranged in odd columns are in alignment with each other along a second direction different from the first direction.

20. The method of forming semiconductor device according to claim 19, wherein the patterns arranged in two adjacent columns are alternately arranged from each other along the second direction.

* * * * *